United States Patent
Nguyen et al.

(10) Patent No.: US 9,900,982 B2
(45) Date of Patent: Feb. 20, 2018

(54) BUTTONED SOLDERING PAD FOR USE WITH FINE-PITCH HOT BAR SOLDERING

(71) Applicant: Finisar Corporation, Sunnyvale, CA (US)

(72) Inventors: Henry Nguyen, San Jose, CA (US); Yuxin Zhou, Fremont, CA (US); Tay Gek-Teng, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 522 days.

(21) Appl. No.: 14/539,545

(22) Filed: Nov. 12, 2014

(65) Prior Publication Data

US 2015/0138742 A1 May 21, 2015

Related U.S. Application Data (60) Provisional application No. 61/903,108, filed on Nov. 12, 2013.

(51) Int. Cl.
*H05K 7/10* (2006.01)
*H05K 1/11* (2006.01)
(Continued)

(52) U.S. Cl.
CPC .............. *H05K 1/113* (2013.01); *H05K 1/111* (2013.01); *H01L 2924/0002* (2013.01); *H05K 1/0269* (2013.01); *H05K 3/363* (2013.01); *H05K 3/4007* (2013.01); *H05K 3/4038* (2013.01); *H05K 2201/0373* (2013.01); *H05K 2201/09381* (2013.01); *H05K 2201/09445* (2013.01);
(Continued)

(58) Field of Classification Search
CPC ............ H01L 2924/0002; H05K 1/113; H05K 1/112; H05K 1/111; H05K 1/0269; H05K 2201/09381; H05K 1/115; H05K 2201/09481; H05K 2203/0465; H05K 2201/09845; H05K 2201/09445; H05K 2201/0373; H05K 3/3436; H05K 1/181
See application file for complete search history.

(56) References Cited

U.S. PATENT DOCUMENTS 5,442,142 A * 8/1995 Hayashi ............... H05K 1/0263
174/250
5,870,289 A * 2/1999 Tokuda ............... H01L 21/6835
174/260

(Continued)

*Primary Examiner* — Steven T Sawyer
(74) *Attorney, Agent, or Firm* — Maschoff Brennan (57) ABSTRACT

A method of soldering can include: providing a first electronic component having a first buttoned soldering pad including a first soldering pad and one or more first button heads protruding from a first surface of the soldering pad; providing a second electronic component having a soldering pad; and soldering the first buttoned soldering pad to the soldering pad. The method includes introducing solder to spaces around the one or more first buttons of the first buttoned soldering pad. The method includes introducing a first solder to spaces around the one or more first buttons of the first buttoned soldering pad; introducing a second solder to spaces around one or more second buttons of a second buttoned soldering pad of the first electronic component; and forming spaces between the first and second solder that electronically insulate the first solder from the second solder.

24 Claims, 9 Drawing Sheets

(51) Int. Cl.
*H05K 1/02* (2006.01)
*H05K 3/36* (2006.01)
*H05K 3/40* (2006.01)

(52) U.S. Cl.
CPC ............. *H05K 2201/09845* (2013.01); *H05K 2203/0465* (2013.01); *Y02P 70/611* (2015.11)

(56) References Cited

U.S. PATENT DOCUMENTS

| | | | |
|---|---|---|---|
| 2003/0029637 A1* | 2/2003 | Barcley | H05K 1/0206 174/262 |
| 2006/0042831 A1* | 3/2006 | Rohde | H05K 1/117 174/262 |
| 2008/0131670 A1* | 6/2008 | Sun | H05K 3/303 428/198 |
| 2008/0139011 A1* | 6/2008 | Uka | H01R 4/024 439/65 |
| 2009/0257209 A1* | 10/2009 | Han | H05K 1/112 361/772 |
| 2010/0214751 A1* | 8/2010 | Aoki | H05K 1/145 361/772 |
| 2011/0226515 A1* | 9/2011 | Son | H01L 23/49827 174/259 |

* cited by examiner

BUTTONED SOLDERING PAD FOR USE WITH FINE-PITCH HOT BAR SOLDERING

CROSS-REFERENCE

This patent application claims priority to U.S. Provisional Application 61/903,108 filed Nov. 12, 2013, which provisional application is incorporated herein by specific reference in its entirety.

BACKGROUND

Previously, solder bridging has been used for hot bar soldering of one electronic component to another. That is, an electronic component can be soldered to another electronic component by using hot bar soldering. In an elemental format, an electronic bond pad can be soldered to another electronic bond pad, where a first electronic device having a first plurality of electronic bond pads can be soldered to a second electronic device having a second plurality of bond pads by hot bar soldering the first plurality of electronic bond pads with corresponding bond pads of the second plurality of bond pads. Hot bar soldering can be effective in bonding the corresponding electronic traces of corresponding electronic components and electronic parts that are dissimilar from each other and difficult to unite together. Some examples, without limitation, of hot bar soldering can include: flex circuit to printed circuit board (PCB); ribbon cable to PCB; coaxial cables; fine-pitch SM devices; edge connectors to PCB; thermocompression bonding; and many others. Hot bar soldering can be effective in connecting data communication device components together, and can withstand the strain and operating conditions of high level data communications across the solder points.

As data communication technologies advance in complication with increased demand for higher data rates and broader bandwidth, the strain of the operating conditions can compromise electronics, especially at junctions between two different electronic components where only localized heat is allowed due to a component's material property constraints. The desire for decreasing the size of microelectronics while increasing data processing and data transmission speeds complicates the manufacturing process because the data lines, such as electronic traces, become smaller but are forced to carry higher data rates with higher bandwidth. Soldering points between dissimilar electronic parts can be especially problematic with decreasing electronic trace cross-sectional dimensions in view of the higher data rates and bandwidth that will pass through the solder. In addition to smaller traces, there is a desire for smaller electronic components to have the electronic traces closer together. Such closeness of the traces complicates the soldering process because it is difficult to solder the individual traces without cross-soldering adjacent traces together, which renders the electronic device useless by shorting the electronic traces. The high density of electronic traces in electronic components, especially when soldering dissimilar electronic components together, provides a problem during manufacturing.

Therefore, there remains a need in the art to improve the hot bar soldering of electronic components with each other.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present technology provides an improvement in hot bar soldering manufacturing protocols by providing an improved soldering pad configuration and method of hot bar soldering. The soldering pad can be configured with buttons that include button heads that protrude from the pad and allow for proper soldering without shorting to adjacent pads. As used herein, a button is described to include a head portion (e.g., button head) that protrudes outwardly from an external surface of the soldering pad as well as a pair of button heads on opposite sides of the soldering pad, and optionally additionally including a thermally connecting member extending between the pair of button heads. As used herein, a soldering pad is described as the electronically and thermally conducting pad member at the end of an electronic trace of a first electronic component that is used for electronic connections to a corresponding soldering pad of another electronic component, and as a pair of electronically and thermally conducting pad members that are electronically and thermally coupled and optionally with a non-conducting (e.g., electronically or thermally) member between portions of the pair of members. Accordingly, the buttoned soldering pad has one or two exposed surfaces with one or more buttons extending from the one or two exposed surfaces, which can be considered a buttoned soldering pad. The two exposed surfaces of the buttoned soldering pad can be on a single pad member or two different pad members with the protruding buttons.

The configuration of the soldering pad with buttons protruding from the soldering pad provides a space between the soldering pads to be soldered together, and that space provides a volume for a reservoir for solder. Accordingly, the space provides a cavity for the solder to spread across without touching adjacent soldering pads of the same electronic component so that there is less cross-contamination of solder between the adjacent soldering pads. This inhibits shorting out the electronic component. The soldering pad with buttons allows for the electronic components to have higher data rates with broader bandwidths in higher packing density because the connections are stabilized by the space with less shorting between adjacent soldering pads due to less cross-soldering across multiple soldering pads. The soldering pads with the buttons also allow for the electronic components to last longer and be more robust compared to soldering connections that are prepared with standard soldering pads (e.g., without buttons) and soldering protocols. In one example, the soldering pad having the buttons can be on a flex and/or a PCB for use in soldering for electronic coupling the flex to the PCB.

The soldering pad with buttons (e.g., buttoned soldering pad) can be robust enough to handle high data rates and bandwidths for data communication between electronic components, such as between flex and PCB components. In one example, the buttoned soldering pad can handle up to 60 GHz; however, modulation of the dimensions may also allow for higher performance capabilities. The buttoned soldering pad can be used with micro traces and high-density traces found in common flex and PCB components.

Figure 1A:
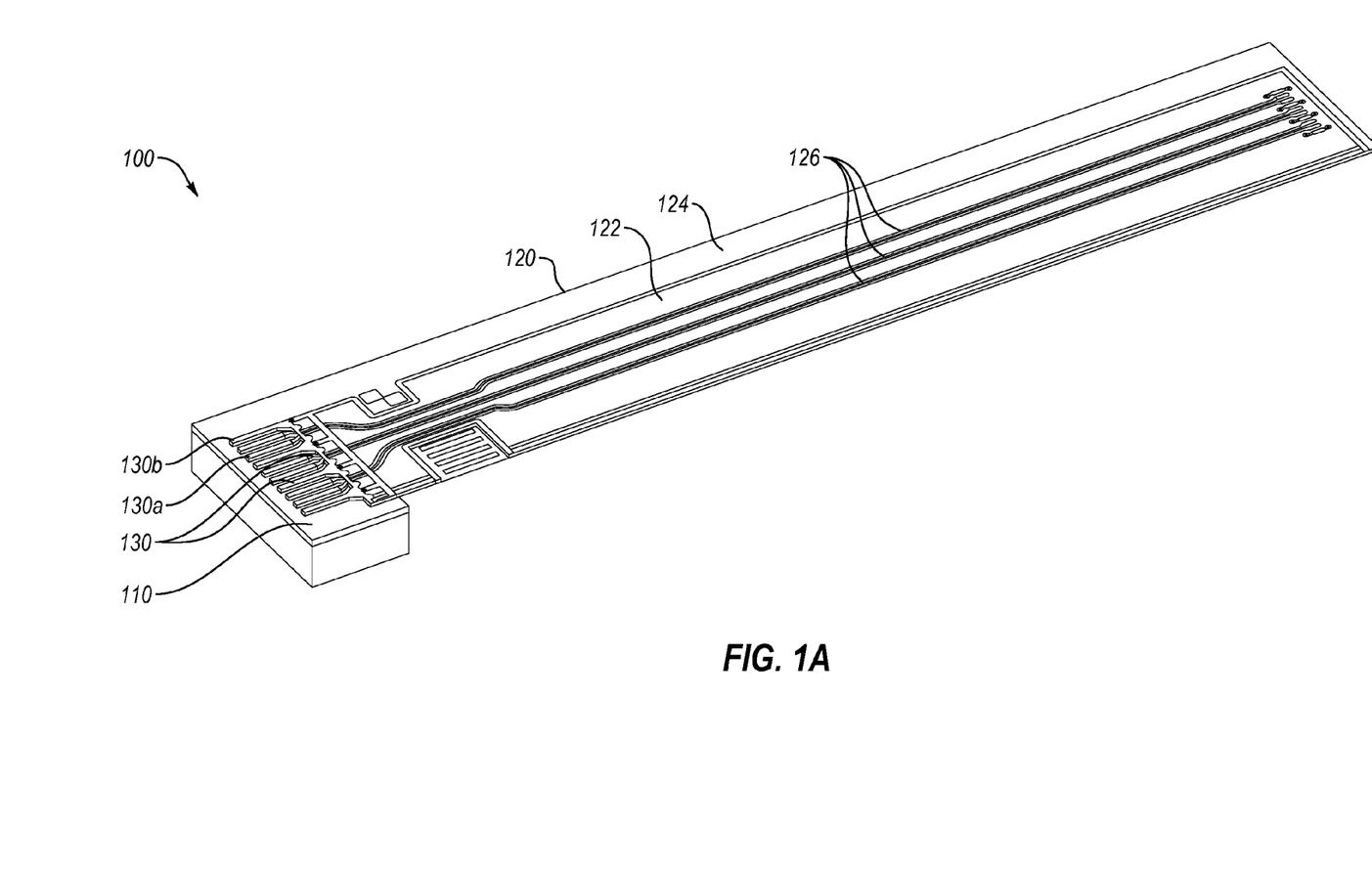
FIG. 1A illustrates an embodiment of an electronic device having a PCB and flex coupled together via hot bar soldering.

FIG. 1A illustrates an embodiment of a device 100 having a PCB 110 and flex 120 coupled together via hot bar soldering. The PCB 110 is electronically coupled to the flex 120 through soldered buttoned soldering pads 130. The PCB 110 is only partially shown for illustration of the soldered buttoned soldering pads 130 for the PCB 110 and flex 120 soldered coupling configuration. The PCB 110 can be configured as is known in the art and can include bond pads 130*a* that form part of the soldered buttoned soldering pads 130. The flex 120 includes a metal member 122 and a flex substrate 124 as well as bond pads 130*b* that form part of the soldered buttoned soldering pads 130. The flex 120 also includes electronic traces 126. The flex 120 can be configured as is known in the art.

The soldered buttoned soldering pads 130 include the bond pads 130*a* of the PCB 110 soldered to the bond pads 130*b* of the flex 120. Here, one or both of the bond pads 130*a*, 130*b* are buttoned soldering pads, such as those described herein.

Figure 1B:
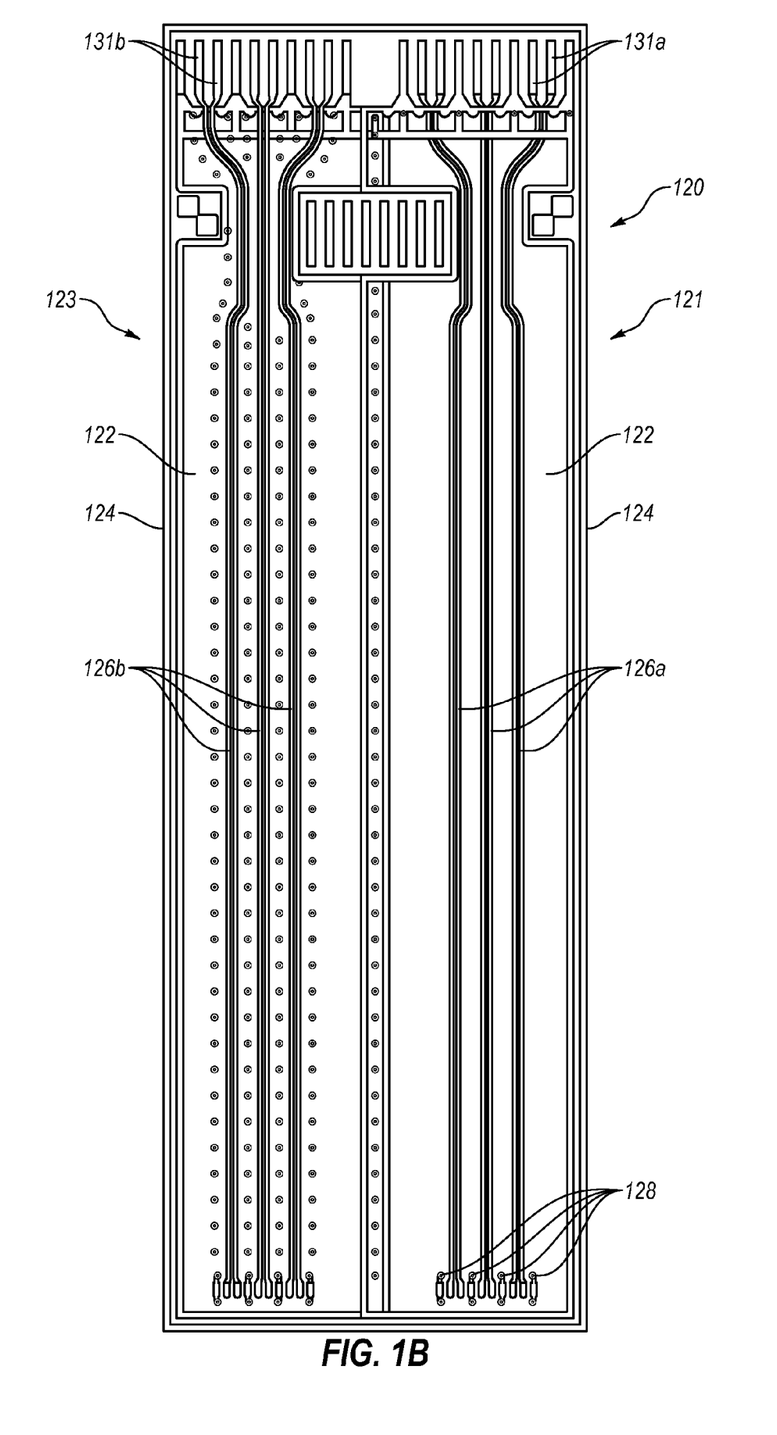
FIG. 1B illustrates an embodiment of flex, where the top and bottom are illustrated next to each other in order to visualize the features thereof.

FIG. 1B shows a schematic of an embodiment of flex 120, where the top surface 121 and bottom surface 123 are illustrated next to each other in order to visualize the features thereof. The traces 126 are pairs of transmission lines, which are shown on the flex 120 (FIG. 1A). The metal member 122 can be a solid metal plane, such as copper, which can function as the ground reference. The flex substrate 124 can be any appropriate substrate, such as polyimide, which flex substrate 124 is between the metal member 122 and the traces 126. The flex 120 of FIG. 1B is illustrated in a manner that shows the top surface 121 and bottom surface 123 side-by-side to allow for visualization of both sides of the device and layered features thereof; however, it is prepared with the top surface 121 on one side and the bottom surface 123 on the other side as is common in the art. The flex 120 can be manufactured as is known, which can include the solid piece of copper (e.g., metal member 122), which forms the ground reference plane for the top traces 126*a*.

The traces 126*a*, 126*b* are shown as pairs of lines, which can be configured to be suitable for at least up to 70-80 GHz. The soldering pads 131*a*, 131*b* are also shown; where each of the traces 126*a*, 126*b* have their own soldering pads 131*a*, 131*b*. As shown, the top surface 121 includes three pairs of top traces 126*a*, which are coupled with one of six individual soldering pads 131*a* so that each top trace 126*a* has its own soldering pad 131*a*. The top traces 126*a* on the top surface 121 are transmission traces. The bottom surface 123 also includes three pairs of bottom traces 126*b*, where each individual bottom trace 126*b* is coupled with one of six individual soldering pads 131*b*. The bottom traces 126*b* on the bottom surface 123 are transmission lines, where there is the metal member 122 that is a reference ground. As shown, the bottom traces 126*b* include vias 128 adjacent thereto. A plurality of vias 128 are shown all along each side of the bottom traces 126*b*, where four rows of vias 128 are along the three pairs of bottom traces 126*b*. The other dots are also vias 128. The vias 128 can provide confinement to allow for higher bandwidth for the flex 120. The vias 128 extend the ground plane from the reference plane to the signal plane. The flex 120 can be manufactured as is known, which can include the solid piece of copper (e.g., metal member 122), which forms the ground reference plane for the top traces 126*a*.

Figure 2A:
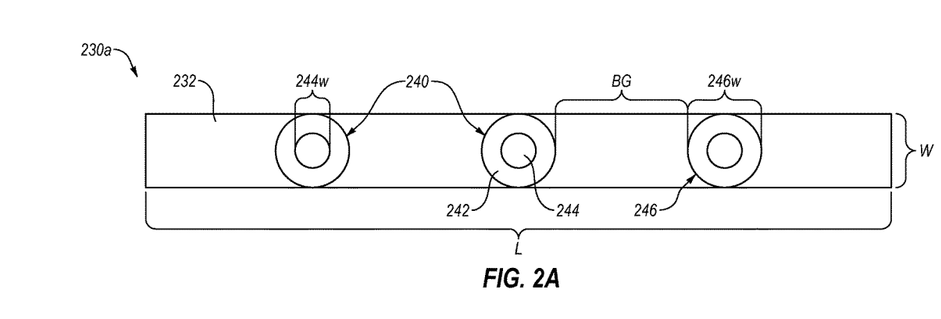
FIG. 2A illustrates a top view of an embodiment of a buttoned solder pad having a solder pad and a plurality of buttons.
Figure 2B:
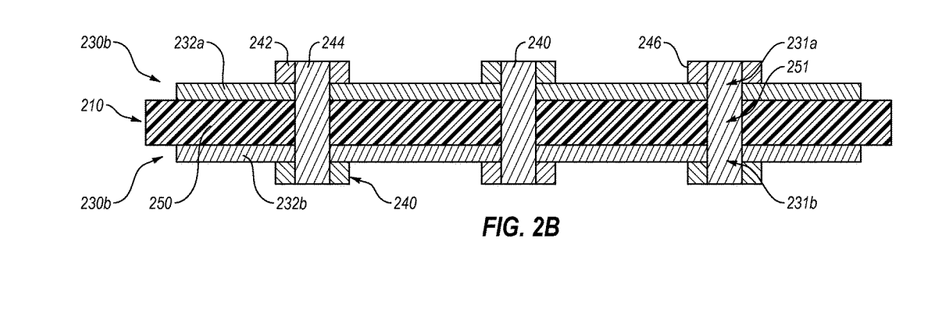
FIG. 2B illustrates a cross-sectional view of an embodiment of a buttoned solder pad.

FIG. 2A shows at top view of a buttoned solder pad 230*a* having a solder pad 232 and a plurality of buttons 240. FIG. 2B is a cross-sectional view of a portion of an electronic device 210 having a buttoned solder pad 230*b* on each side of a center substrate 250, which can be any electronic device 210. With reference to FIG. 2A, the solder pad 232 can have a width W that is about 120 microns, or a range therearound, and a length L that can vary as designed. The solder pad 232 can include any number of buttons 240; however, three buttons 240 are illustrated. The buttons 240 can be spaced apart on the solder pad 232 at a range of distances so as to provide a button gap BG. The buttons 240 can each have an annular head 242 with a central core 244 within the annular head 242, which can be different members coupled together or they can be integrated as the same unitary material. The annular head 242 and at least a portion of the central core 244 combine to form the button head 246 that extends from the surface of the solder pad 232. While the solder pad 232 and buttons 240 may be different materials, they may also be made from the same material, and while they are illustrated as separate members, they may be a unitary member (e.g., formed around the center substrate 250).

FIG. 2B shows a first solder pad 232a is on one side of the center substrate 250 and a second solder pad 232b is on a second side of the center substrate 250. The center substrate 250 can be a non-conducting material, such as an insulator, or be a semiconductor. As shown, the first solder pad 232a can include a first solder pad aperture 231a extending therethrough, the center substrate 250 can include center substrate aperture 251 that is aligned with the first solder pad aperture 231a, and the second solder pad 232b can include a second solder pad aperture 231b aligned with the first solder pad aperture 231a and the center substrate aperture 251. The button 240 is inserted through the first solder pad 232a, center substrate 250 and second solder pad 232b by having the central core 244 extending through the first solder pad aperture 231a, center substrate aperture 251 and second solder pad aperture 231b.

With reference to FIG. 2A, the button heads 246 can have a width 246w that can vary according to the electrical component type, and the central core 244 can have a width 244w that can vary according to the electrical component type. While the button head width 246w is shown to have a dimension that is the same as the solder pad width W, either can have a dimension larger or smaller than the other. In some instances, however, it can be preferred that the button head width 246w is smaller than the solder pad 232 width W. Also, while the button head 246 is shown to be wider than the central core 244, the button head 246 may optionally have a dimension that is narrower or smaller than the dimension of the central core 244.

In one embodiment, the buttons 240 can be vias. The vias can be configured as the buttons 240 described herein in connection to the soldering pads 232. References to buttons 240 herein also refer to vias. The buttons 240 as vias can have at least two beneficial functions: 1) to create space for the solder; and 2) transfer heat from the hot bar sintering device to the solder between the buttoned soldering pad and the soldering pad being soldered thereto.

While a certain number of buttons 240 are shown for each soldering pad 232, the number can be 1, 2, 3, 4, 5, 6, 7, 8, 9, 10, or more buttons 240 per soldering pad 232.

In one embodiment, the buttons 240 create a space between the flex 120 and PCB 110 (FIG. 1A) when used in soldering, which space can receive and retain solder used during the hot bar soldering process. The space retains the solder and inhibits bridging, and thereby inhibits electronic shorting of the flex 120 and/or PCB 110 by inhibiting adjacent soldering pads 232 from being electronically connected by bridged solder. The dimensions can be modulated to create sufficient space to inhibit bridging and subsequent shorting. The hot bar soldering uses the heated element, which contacts the buttons 232 to facilitate the soldering process.

Figure 2C:
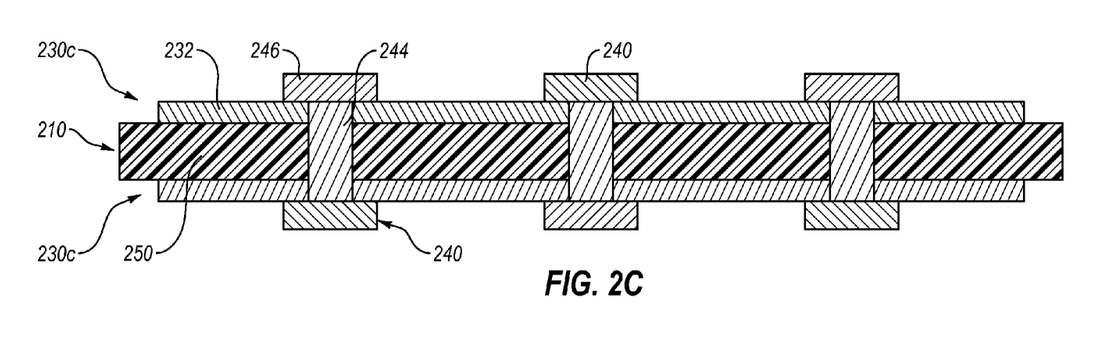
FIG. 2C illustrates a cross-sectional view of an embodiment of buttoned solder pad having the center substrate with a solder pad on each side and three buttons on each solder pad.

FIG. 2C shows an embodiment of an electronic device 210 having a buttoned solder pad 230c of each side of a center substrate 250. Each buttoned solder pad 230c includes a solder pad 232 and buttons 240 on each solder pad 232. The buttons 240 are configured with a central core 244 with a head 246 on each end. The solder pad 232 and buttons 240 can be the same material or different. Here, at least one of the heads 246 is coupled to the central core 244 or formed thereon after insertion through the center substrate 250 and solder pads 232, such as through the first solder pad aperture 231a, center substrate aperture 251 and second solder pad aperture 231b (FIG. 2B). Optionally, the central core 244 can be inserted through the first solder pad aperture 231a, center substrate aperture 251 and second solder pad aperture 231b, and the heads 246 can be coupled to each end. The coupling can be by plating, welding, brazing, adhesive, or the like. In another option, the core 244 can be inserted, and then the head 246 formed from the core 244 by flattening the end of the core 244 (FIG. 2E).

Figure 2D:
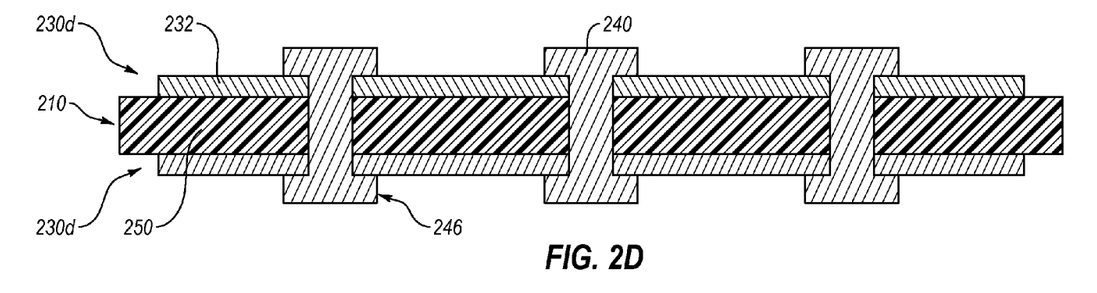
FIG. 2D illustrates a cross-sectional view of an embodiment of buttoned solder pad having the center substrate with a solder pad on each side and three buttons on each solder pad.
Figure 2E:
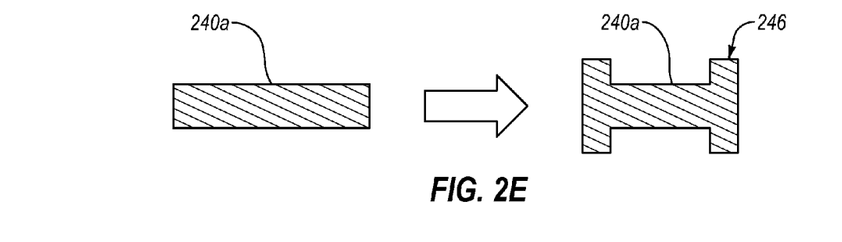
FIG. 2E illustrates a cross-sectional view of an embodiment of process of forming a button with two button heads from a core member.

FIG. 2D shows an embodiment of an electronic device 210 having a buttoned solder pad 230d on each side of the center substrate 250. Each buttoned solder pad 230b can include a solder pad 232 and buttons 240 on each solder pad 232. The buttons 240 are configured with a unitary member in an I shape. The solder pad 232 and buttons 240 can be the same material or different. The I-shaped buttons 240 can be formed by inserting an elongate button 240a, and then pressing the ends or otherwise deforming the ends to form the heads 246 on each end to form the I shape, which is shown in FIG. 2E.

Figure 2F:
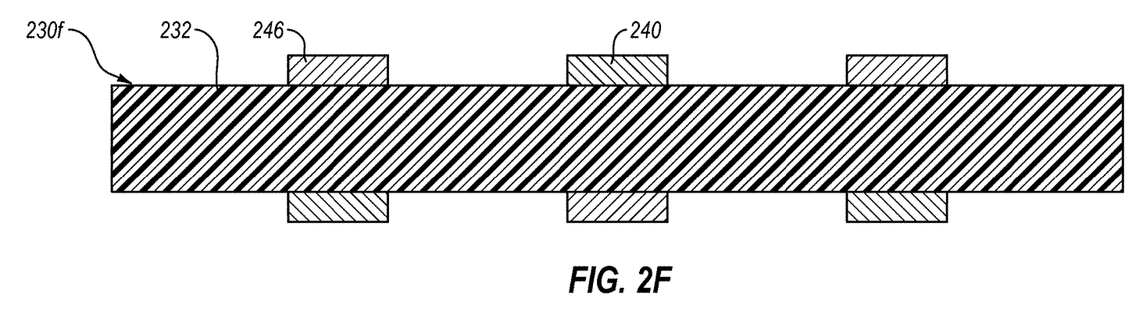
FIG. 2F illustrates a cross-sectional view of an embodiment of a buttoned solder pad that has the solder pad with button heads on each side.

FIG. 2F shows an embodiment of a buttoned solder pad 230f without a center substrate, and which has the solder pad 232 with button heads 246 on each side. Here, the buttons 240 are button heads 246 without a central core. The solder pad 232 can be formed with the button heads 246 thereon, or the button heads 246 can be attached to the solder pad 232 by welding, brazing, adhesive, or other attachment means.

Figure 2G:
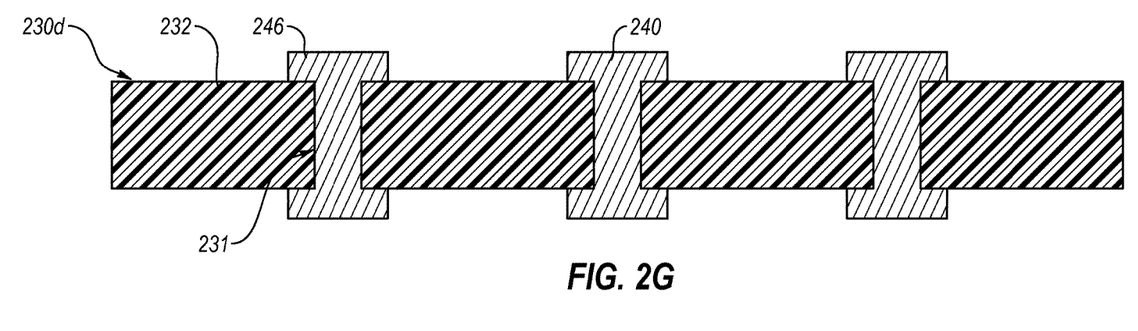
FIG. 2G illustrates a cross-sectional view of an embodiment of a buttoned solder pad that has the solder pad with the buttons having a central core and button heads.

FIG. 2G shows an embodiment of a buttoned solder pad 230g without a center substrate, and which has the solder pad 232 with the buttons 240 on each side. The buttons 240 include the central core 244 and button heads 246. Here, the solder pad 232 can include an aperture 231 receiving the central core 244 therethrough. The buttons 240 of FIG. 2G can be formed as shown by FIG. 2E or can be configured in accordance with any of FIGS. 2A-2E.

Figure 2H:
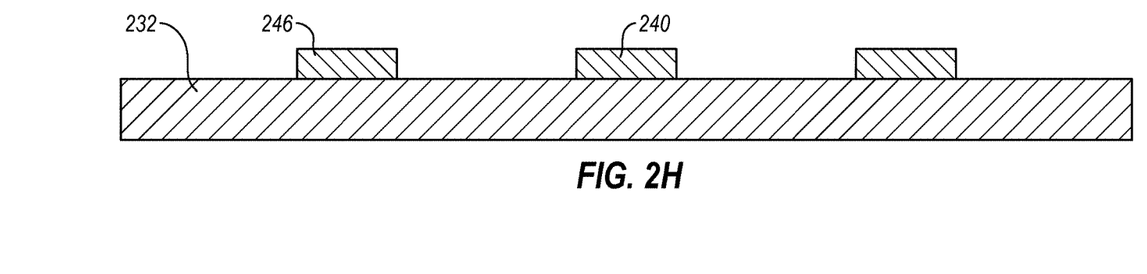
FIG. 2H illustrates a cross-sectional view of an embodiment of a buttoned solder pad that has button heads as the buttons on one side of the solder pad.

FIG. 2H shown an embodiment of a buttoned solder pad 230h that only has button heads 246 as the buttons 240 on one side of the solder pad 232.

It should be recognized that the different buttoned solder pads of FIGS. 2A-2H can be used for different soldering functions to solder different electronic components together. These buttoned solder pads can be useful for coupling flex electronic components to PCB components. The buttoned solder pads can be soldered to soldering pads of other electronic components, which soldering pads may be buttoned or not buttoned.

In one embodiment, the buttoned soldering pads described herein can be used without solder, and can thereby be considered buttoned welding pads, which can be welded to other welding pads that are buttoned or not buttoned. However, the buttoned pads are referred to herein as buttoned soldering pads for simplicity even though they can be used for welding.

In one embodiment, the buttoned soldering pads described herein can be used with adhesive instead of solder, and can thereby be considered buttoned pads, which can be adhered to other pads that are buttoned or not buttoned. However, the buttoned pads are referred to herein as buttoned soldering pads for simplicity even though they can be used for adhesive coupling. Here, the adhesive can be used similarly to solder, and may be applied in an amount that does bridge between adjacent pads when the adhesive does not conduct electricity. If the adhesive is electrically conductive, and amount of such conductive adhesive can be used that does not bridge adjacent pads of the same electronic device.

Figure 3A:
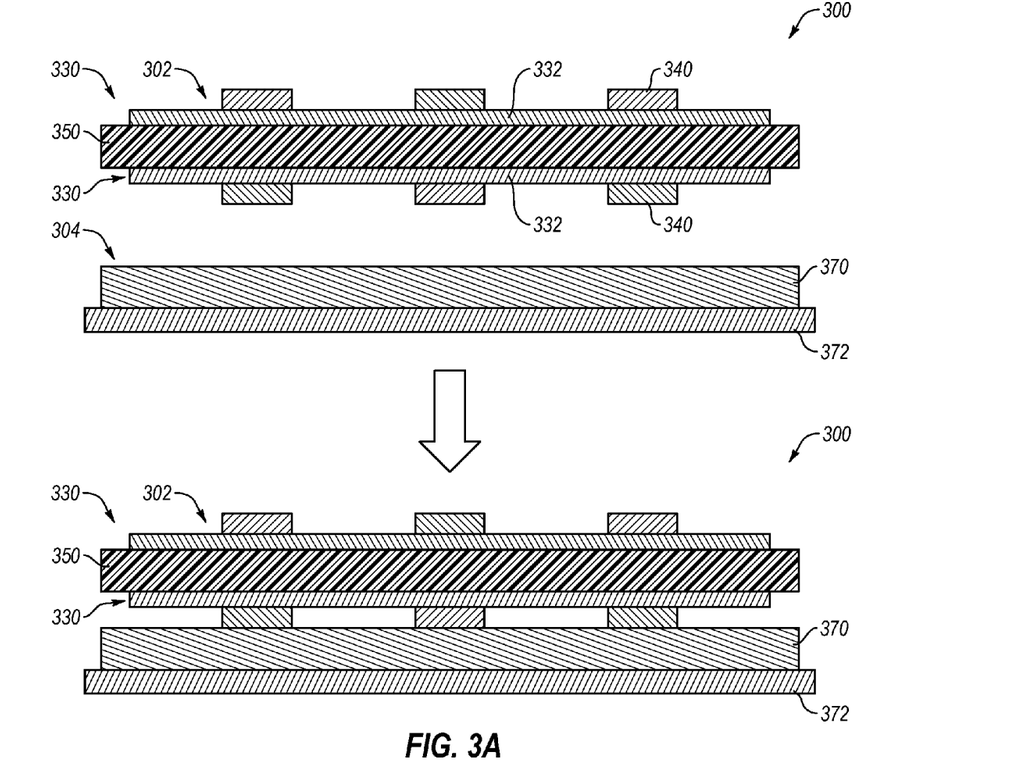
FIG. 3A illustrates a cross-sectional view of an embodiment of a welding process.
Figure 3B:
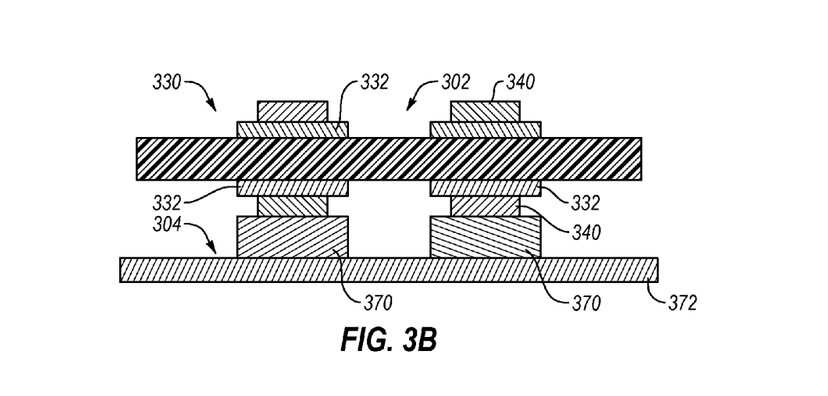
FIG. 3B illustrates an end view showing a plurality of buttoned welding pads welded to different welding pads.

FIGS. 3A-3B show an embodiment of a process 300 of welding of a buttoned welding pad 330 of a first electronic component 302 to a welding pad 370 of a second electronic component 304. The first electronic component 302 is shown to have a welding pad 330 on each side of an optional center substrate 350. The buttoned welding pad 330 can be configured as shown or other configuration as described herein for the buttoned soldering pads or electronic components having the same. Here, the buttoned welding pad 330 includes a welding pad 332 having buttons 340. The welding pad 370 can be on a substrate 372. As shown, the process 300 includes: (1) providing a buttoned welding pad 330 of a first electronic component 302 and a welding pad 370 of a second electronic component 304; and (2) welding the buttoned welding pad 330 to the welding pad 370 so as to electronically couple the first electronic component 302 to the second electronic component 304. Here, the buttons 340 are directly welded to the welding pad 370. The first electronic component 302 can be flex and the second electronic component 304 can be PCB, or vice versa. FIG. 3A shows the welding process 300 on a side view with the buttoned welding pad 330 having a plurality of buttons 340. FIG. 3B shows the welded components on an end view showing a plurality of buttoned welding pads 330 welded to different welding pads 370.

Figure 4A:
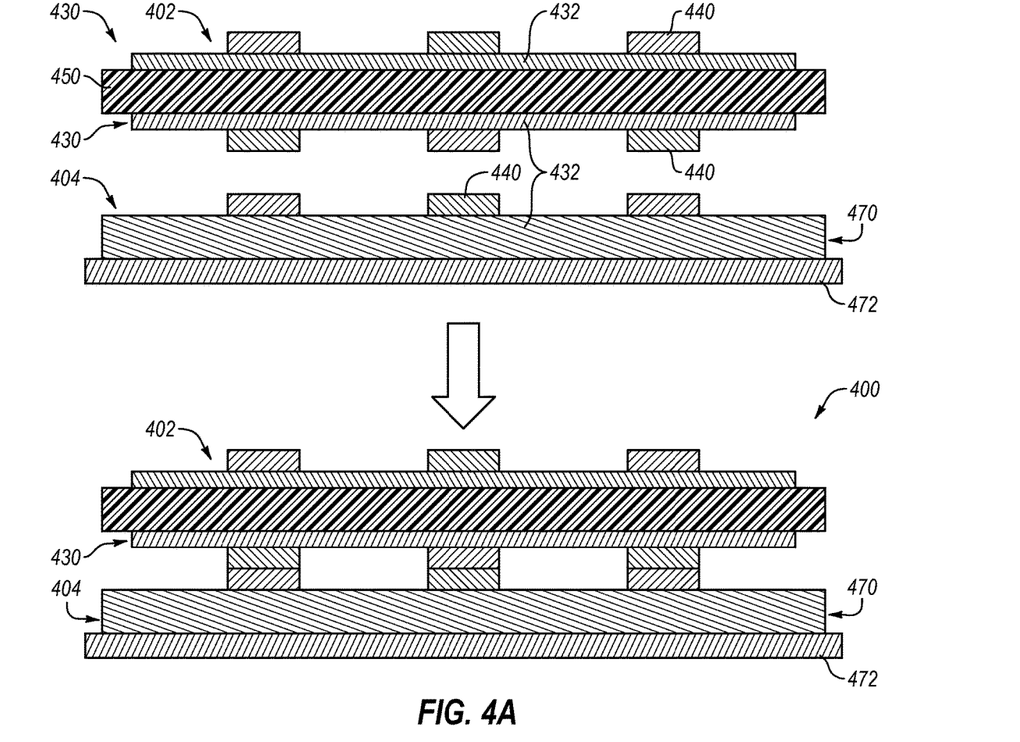
FIG. 4A illustrates a cross-sectional view of an embodiment of a welding process.
Figure 4B:
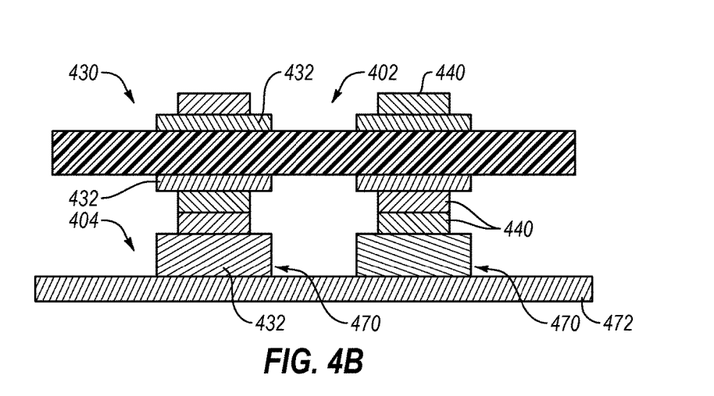
FIG. 4B illustrates an end view showing a plurality of buttoned welding pads welded to different buttoned welding pads.

FIGS. 4A-4B show an embodiment of a process 400 of welding of a buttoned welding pad 430 of a first electronic component 402 to a buttoned welding pad 470 of a second electronic component 404. The first electronic component 402 is shown to have a welding pad 430 on each side of an optional center substrate 450. The buttoned welding pads 430, 470 can be configured as shown or other configuration as described herein to include a welding pad 432 having buttons 440. The buttoned welding pad 470 can be on a substrate 472. As shown, the process 400 includes: (1) providing a buttoned welding pad 430 of a first electronic component 402 and a buttoned welding pad 470 of a second electronic component 404; and (2) welding the buttoned welding pad 430 to the buttoned welding pad 470 so as to electronically couple the first electronic component 402 to the second electronic component 404. The first electronic component 402 can be flex and the second electronic component 404 can be PCB, or vice versa. FIG. 4A shows the welding process 400 on a side view with the buttoned welding pads 430, 370 having a plurality of buttons 440. FIG. 4B shows the welded components on an end view showing a plurality of buttoned welding pads 430 of the first component 402 welded to different buttoned welding pads 470 of the second component 404. Here, the buttons 440 of the first electronic component 402 are welded to the buttons 440 of the second electronic component 404.

Figure 5A:
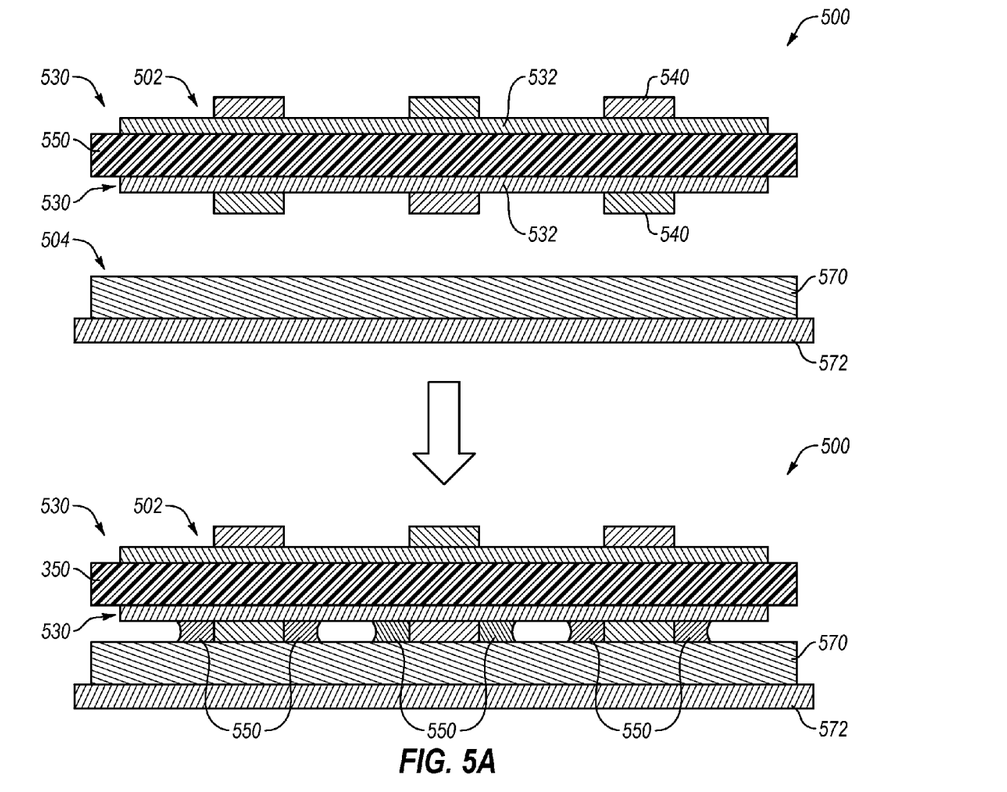
FIG. 5A illustrates a cross-sectional view of an embodiment of a soldering process.
Figure 5B:
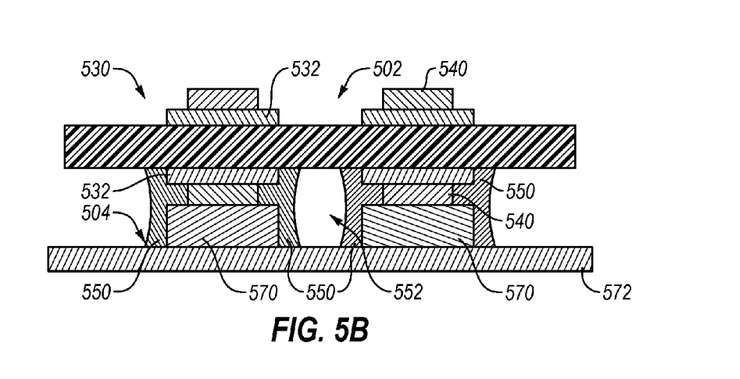
FIG. 5B illustrates an end view showing a plurality of buttoned soldering pads soldered to different soldering pads.

FIGS. 5A-5B show an embodiment of a process 500 of soldering a buttoned soldering pad 530 of a first electronic component 502 to a soldering pad 570 of a second electronic component 504. The first electronic component 502 is shown to have a soldering pad 530 on each side of an optional center substrate 550. The buttoned soldering pads 530 can be configured as shown or other configuration as described herein to include a soldering pad 532 having buttons 540. The soldering pad 570 can be on a substrate 572. As shown, the process 500 includes: (1) providing a buttoned soldering pad 530 of a first electronic component 502 and a soldering pad 570 of a second electronic component 504; and (2) soldering the buttoned soldering pad 530 to the soldering pad 370 with solder 550 so as to electronically couple the first electronic component 502 to the second electronic component 504. The solder 550 can be any type of solder used for electronically coupling electronic components together, such as standard solder. The solder 550 can be applied as is common with hot bar soldering, which may also be reflow hot bar soldering. The first electronic component 502 can be flex and the second electronic component 504 can be PCB or vice versa, and the solder 550 can be the kind used for coupling these types of electronic components together. FIG. 5A shows the soldering process 500 on a cross-sectional side view with the buttoned soldering pad 530 soldered to the soldering pad 570. However, the solder 550 can be applied in an amount such that the solder 550 does not connect to or touch adjacent buttons 540 of the same solder pad 532 or different soldering pads 532, and each button has solder 550 there around or adjacent to and contacting one or more sides of the button 540. That is, each button 540 can have solder 550 that does not contact an adjacent button 540.

FIG. 5B shows the soldering components on an end view showing a plurality of buttoned soldering pads 530 soldered to different soldering pads 570. The soldering process 500 is performed in such a way that the solder 550 does not touch two adjacent soldered buttoned soldering pads 530/soldering pads 570, and thereby a gap 552 is provided between two adjacent soldered buttoned soldering pads 530/soldering pads 570, which keeps the adjacent soldered pads of each individual electronic component from being electronically coupled. This gap 552 electronically isolates each soldered buttoned soldering pad 530 and soldering pad 570 from the adjacent soldered buttoned soldering pad 530 and soldering pad 570.

Figure 6A:
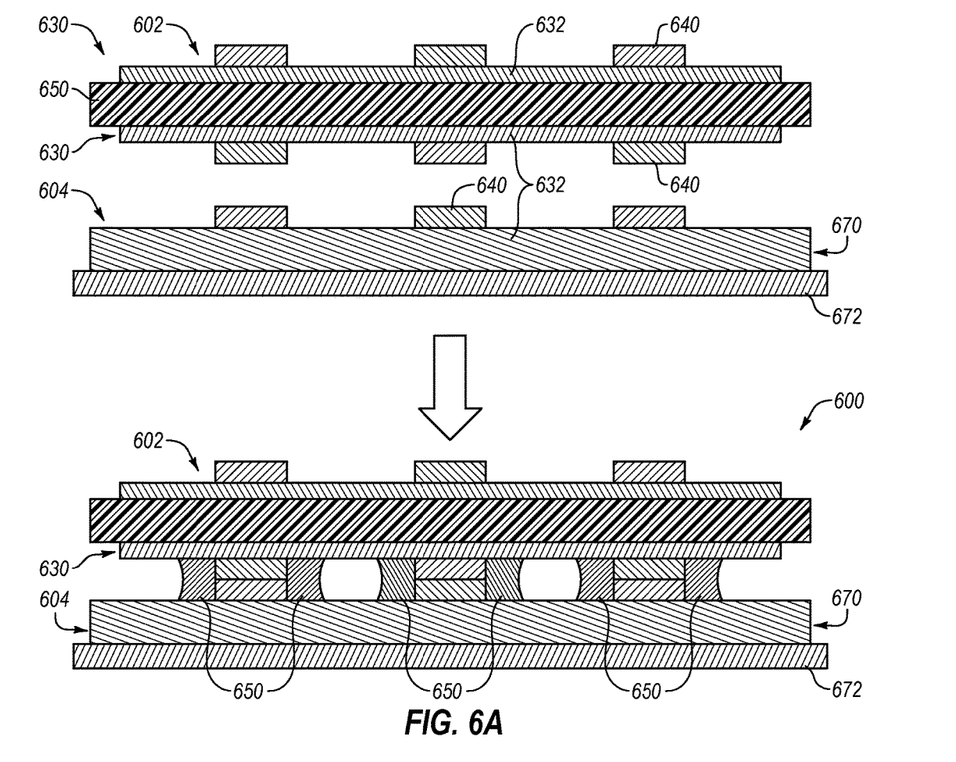
FIG. 6A illustrates a cross-sectional view of an embodiment of a soldering process.
Figure 6B:
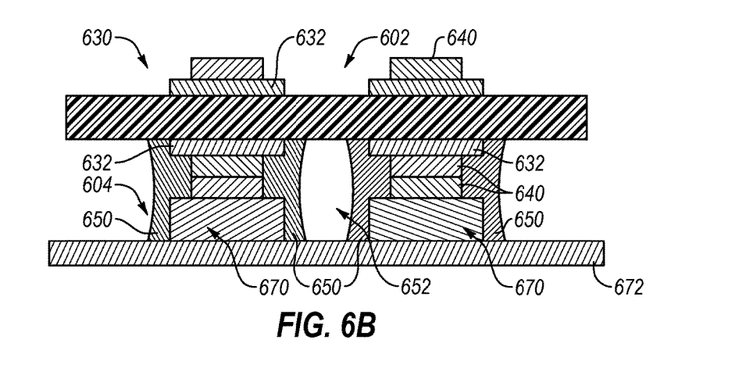
FIG. 6B illustrates an end view showing a plurality of buttoned soldering pads soldered to different buttoned soldering pads.

FIGS. 6A-6B show an embodiment of a process 600 of soldering a buttoned soldering pad 630 of a first electronic component 602 to a buttoned soldering pad 670 of a second electronic component 604. The first electronic component 602 is shown to have a soldering pad 630 on each side of an optional center substrate 650. The buttoned soldering pads 630, 670 can be configured as shown or other configuration as described herein to include a soldering pad 632 having buttons 640. The buttoned soldering pad 670 can be on a substrate 672. As shown, the process 600 includes: (1) providing a buttoned soldering pad 630 of a first electronic component 602 and a buttoned soldering pad 670 of a second electronic component 604; and (2) soldering the buttoned soldering pad 630 to the buttoned soldering pad 670 with solder 650 so as to electronically couple the first electronic component 602 to the second electronic component 604. The solder 650 can be any type of solder used for electronically coupling electronic components together, such as standard solder. The solder 650 can be applied as is common with hot bar soldering, which may also be reflow hot bar soldering. The first electronic component 602 can be flex and the second electronic component 604 can be PCB or vice versa, and the solder 650 can be the kind used for coupling these types of electronic components together. FIG. 6A shows the soldering process 600 on a cross-sectional side view with the buttoned soldering pad 630 soldered to the buttoned soldering pad 670. However, the solder 650 can be applied in an amount such that the solder 650 does not connect to or touch adjacent buttons 640, and each button has solder 650 there around or adjacent to and contacting one or more sides of the button 640. That is, each button 640 can have solder 650 that does not contact an adjacent button 640 of the same soldering pad 632 or adjacent soldering pad 632 of the same device. Of course, the solder 650 can solder a button 640 of the first electronic component 602 to a button 640 of the second electronic component.

FIG. 6B shows the soldering components on an end view showing a plurality of buttoned soldering pads 630 soldered to different buttoned soldering pads 670. The soldering process 600 is performed in such a way that the solder 650 does not touch two adjacent soldered buttoned soldering pads 630/buttoned soldering pads 670 of the same electronic device, and thereby a gap 652 is provided between two adjacent soldered buttoned soldering pads 630/buttoned soldering pads 670 of the same electronic device, which keeps the adjacent buttoned soldering pads 630/buttoned soldering pads 670 of each individual electronic component from being electronically coupled to other buttoned soldering pads of the same component. Of course, the solder 650 can solder a button 640 of the first electronic component 602 to a button 640 of the second electronic component. This gap 652 electronically isolates each soldered buttoned soldering pad 630 and buttoned soldering pad 670 from the adjacent soldered buttoned soldering pad 630 and buttoned soldering pad 670.

In the processes shown herein, the buttoned soldering pad can be adhered to the soldering pad to which it is to be soldered by an adhesive, such as polyimide adhesive, prior to soldering. Adhesive can similarly be used in the welding embodiments.

In one embodiment, buttoned soldering pads can be used for any soldering of electronic components, including edge buttoned soldering pads and internal buttoned soldering pads. In one example, a flex with 350-micron pitch and 120-micron pad with multiple via structures can be configured with the buttoned soldering pads. The process for soldering electronic components together can be performed by fine-pitch hot bar soldering, as the hot bar soldering is used on electronic components with fine pitch between adjacent soldering pads.

The dimensions of the buttons, buttoned soldering pads, and substrates having buttoned soldering pads on each side can vary. In one example, a dimension from head to head of a button can be about 150 microns, or +/−1%, 2%, 5%, 10%, or 20% or more in some embodiments. In one example, the head to head dimension can be about 148.49 microns, and another example can be about 155.57 microns. However, other dimensions can be used. The buttons and pads can be plated copper, which is the same material used in the ground and signal layer of a flex.

Based on raw flex having buttoned soldering pads, cross-sectional analysis can illustrate variable button heights (e.g., head to head). The raw flex height can vary with a change of about 20 microns or more. Also, it has been found that a button surface may be fabricated to be flat, but the hot bar heating may put dents into the top button surface that interacts with the bar. However, a newly manufactured button can have irregular surfaces on the button head. In one example, if the core is 50 microns, each button head height can be about 44-55 microns range. The average button dimension from head to head was found to be about 150 microns, with a maximum of 158 microns and a minimum of 135 microns; however, these values may be +/−1%, 2%, 3%, 4%, 5%, 10%, 20%, 25%, 30%, 40%, or 50%. The following specific button heights were produced: 140.97; 146.68; 148.59; 151.13; 153.04; 154.94; 155.57; 156.57; 157.48; 155.57; 157.48; 158.11; 157.48; 156.21; 154.94; 150.49; 149.22; 144.15; 139.7; 135.89; 138.43; 144.15; 147.96; 150.49; 151.76; 152.4; 153.67; 156.85; 154.3; 151.76; 153.04; 153.67; 153.04; 149.22; 148.59; 146.68; 143.51; 138.43; and 135.89. However, any dimension can be used. Also, the button height dimension can vary based on the thickness of the soldering pad(s) and substrate having the same as well as the electronic component having the same. Accordingly, the height of a single button head from a pad surface can be about 5 microns to about 50 microns, or +/−1%, 2%, 3%, 4%, 5%, 10%, 20%, 25%, 30%, 40%, or 50% thereof.

In one embodiment, the following dimensions may be used, but are for example purposes, and thereby not limiting: top button head can be 13 microns; top soldering pad can be 17.1 microns; substrate (core) can be 50 microns; bottom soldering pad can be 17.1 microns; and bottom button head can be 13 microns, which results in a button-to-button distance (button height) of about 130 microns, which can be +/−20%. Because the soldering process and flex fabrication are different process lines, the thickness of the button are optimized by matching the solder volume from the solder stencil opening with the solder reservoir volume created by the buttons.

In one embodiment, the solder forms around the buttons of the buttoned soldering pad and electronically couples the buttoned soldering pad of the flex (e.g., first electronic component) with the soldering pad of the PCB (e.g., second electronic component). The solder can fill the gap between PCB and flex around the buttons. However, adjacent buttons may not be soldered together, such that there is a gap therebetween. Also, adjacent buttoned soldering pads of the same device may not be soldered together, such that there is a gap therebetween. During experimental analysis, x-ray micrographs (not shown) of hot bar soldered joints between flex and PCB using the buttoned soldering pad showed the soldering does not bridge between adjacent buttoned soldering pads of the same device. A first experiment used 85% stencil aperture openings, where the x-ray micrographs showed that the left and right sides got good reflow without bridging, but some solder oozing is shown to extend from a few buttoned soldering pad; however, the oozed solder is not sufficient to cause electrical coupling between adjacent buttoned soldering pads. A second experiment used 90% stencil aperture openings, where the x-ray micrographs show that the left and right sides got good reflow without bridging, but some solder oozing is shown to extend from some of the buttoned soldering pad; however, the oozed solder is not sufficient to cause electrical coupling between adjacent buttoned soldering pads. A third experiment used 100% stencil aperture openings, where the x-ray micrographs show that the left and right sides got good reflow without bridging, but some solder oozing is shown to extend from most of the buttoned soldering pad; however, the oozed solder is not sufficient to cause electrical coupling between adjacent buttoned soldering pads. Accordingly, by varying the amount of the solder stencil opening, the optimized solder volume can be achieved.

Data showed that the hotbar interface's bandwidth can achieve more than 45 GHz. Data also showed that the measurement and calculated response are very close, which means more bandwidth may be possible for further optimization.

Data also shows that the hotbar interface's return loss measurement data are very close to the calculated number, which means less return loss is possible for further optimization.

Accordingly, the buttons provide for reservoirs to hold the solder between the buttoned soldering pad and the corresponding soldering pad that is soldered thereto. The volume of solder used can be modulated to inhibit oozing and further inhibit the potential for bridging between adjacent buttoned soldering pads of the same device.

It is noted that hot bar soldering processing is known, and the contribution of the buttoned soldering pads is provided herein, and combined with the knowledge in the art, provides support for the actions of hot bar soldering. Also, fine-pitch electronic components are known to be electronically coupled with hot bar soldering, and such is referred to as fine-pitch hot bar soldering.

In the fine pitch hot bar soldering process, the thermal mode can be used to press down the flex on the PCB after they get aligned, during a 30 second pre-heat and heat soak process, the temperature of the thermal mode is set at 400 degree C., the solder is melt at 230 degree C. The thermal mode turns off before the hot bar thermal mode is removed after the hot bar process completed.

In one embodiment, a buttoned soldering pad can include: a soldering pad; and one or more first button heads protruding from a first surface of the soldering pad. Each first button head has a width dimension that is smaller than, larger than, or is about the same size of a width dimension of the soldering pad.

In one embodiment, the soldering pad has one or more second button heads protruding from a second surface of the soldering pad, the second surface being opposite of the first surface. In one aspect, each first button head on the first surface of the soldering pad has a button core extending to a corresponding second button head. In one aspect, each first button head, button core and second button head combination is an integrated member. In one aspect, each first button head, button core and second button head combination includes separate members that are coupled together.

In one embodiment, the soldering pad further includes: a center substrate; a first soldering pad member having the first surface of the soldering pad located on a first side of the center substrate; a second soldering pad member having a the second surface of the soldering pad located on a second side of the center substrate, the first side being opposite of the second side of the center substrate such that the first buttons are protrude in a direction opposite from the protrusion of the second buttons; and a button core member extending between the first button head and second button head, the button core being thermally and electronically conductive. In one aspect, the center substrate includes one or more substrate apertures extending therethrough; and each first button head has a button core extending through the one or more substrate apertures to a corresponding second button head. In one aspect, the soldering pad includes one or more pad apertures extending therethrough, each button core extending through one of the one or more pad apertures to the corresponding second button head.

In one embodiment, an electronic device can include: the buttoned soldering pad of one of the embodiments; and electronic traces on a substrate that are electronically coupled with the buttoned soldering pad.

In one embodiment, an electronic device can include: the buttoned soldering pad of one of the embodiments; and electronic traces on the center substrate that are electronically coupled with the buttoned soldering pad.

In one embodiment, an electronic device can include: a first electronic component having a first buttoned soldering pad; a second electronic component having a second buttoned soldering pad, the first and second buttoned soldering pads being configured according to one of the embodiments; and a first solder located around a first button head of the first buttoned soldering pad and located around a second button head of the second buttoned soldering pad.

In one embodiment, an electronic device can include: the first electronic component having a third buttoned soldering pad; the second electronic component having a fourth buttoned soldering pad, the third and fourth buttoned soldering pads being configured according to the first and second buttoned soldering pads; and a second solder located around a third button head of the third buttoned soldering pad and located around a fourth button head of the fourth buttoned soldering pad; and a gap between the first and second solder. In one aspect, the first buttoned soldering pad and third buttoned soldering pad are electronically isolated from each other by the gap; and the second buttoned soldering pad and fourth buttoned soldering pad are electronically isolated from each other by the gap.

In one embodiment, a method of soldering electronic components together can include: providing a first electronic component having a first buttoned soldering pad, the first buttoned soldering pad including a first soldering pad and one or more first button heads protruding from a first surface of the soldering pad; providing a second electronic component having a soldering pad; and soldering the first buttoned soldering pad to the soldering pad so as to electronically couple the first electronic component to the second electronic component. In one aspect, the method includes introducing solder to spaces around the one or more first buttons of the first buttoned soldering pad.

In one embodiment, the soldering method can include: introducing a first solder to spaces around the one or more first buttons of the first buttoned soldering pad; introducing a second solder to spaces around one or more second buttons of a second buttoned soldering pad of the first electronic component; and forming spaces between the first and second solder that electronically insulate the first solder from the second solder. In one aspect, the soldering method can include introducing the second solder so as to electronically couple the one or more second buttons with a second soldering pad of the second electronic component.

In one embodiment, the soldering includes performing hot bar soldering for the soldering protocol. As such, a hot bar soldering machine can be included in a system having the buttoned soldering pads. In one aspect, the hot bar soldering can include contacting a hot bar soldering apparatus with the first buttoned soldering pad so as to transfer heat therethrough to heat solder associated with the one or more first button heads and the soldering pad.

In one embodiment, the soldering method is conducted by performing the soldering so that the solder is retained in spaces created by the one or more first button heads between the first soldering pad of the first electronic component and the soldering pad of the second electronic component.

In one embodiment, the soldering method is conducted by performing the soldering so as to inhibit solder from bridging between adjacent buttoned soldering pads of the first electronic component.

In one embodiment, the soldering method is conducted by performing the soldering so as to inhibit solder from bridging between adjacent soldering pads of the second electronic component.

In one embodiment, the soldering method is conducted by applying pressure by a hot bar soldering apparatus in an amount that does not cause solder bridging between adjacent buttoned soldering pads the first electronic component.

In one embodiment, the soldering method is analyzed to make sure that adjacent soldering pads of an electronic component do not have solder bridging. As such, the method can be conducted by imaging an area around the soldered first buttoned soldering pad and soldering pad; and determining whether or not there is solder bridging between adjacent buttoned soldering pads of the first electronic component and/or determining whether or not there is solder bridging between adjacent soldering pads of the second electronic component. In one aspect, if there is solder bridging between adjacent buttoned soldering pads and/or between adjacent soldering pads, an electronic device having the solder bridging is discarded. In one aspect, if there is no solder bridging between adjacent buttoned soldering pads and/or between adjacent soldering pads, an electronic device devoid of solder bridging is further processed to prepare the electronic device.

In one embodiment, the soldering method can include soldering a flex having the buttoned soldering pad to a PCB having the soldering pad, wherein the flex is the first electronic component and the PCB is the second electronic component.

In one embodiment, the soldering method can include soldering a flex having the soldering pad to a PCB having the buttoned soldering pad, wherein the PCB is the first electronic component and the flex is the second electronic component.

In one aspect, the soldering pad of the second electronic component is a buttoned soldering pad.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims. All references, such as the provisional application, recited herein are incorporated herein by specific reference in their entirety.

The invention claimed is:

1. A buttoned soldering pad system comprising:
a first soldering pad having a first surface and a second surface; and
a plurality of first button heads protruding from a first surface of the soldering pad, the plurality of first button heads each being spaced apart from each other;
a center substrate having a first side and a second side;
the soldering pad having the second surface of the soldering pad located on the first side of the center substrate;
a second soldering pad having a plurality of second button heads protruding from a first surface of the second soldering pad, the plurality of second button heads each being spaced apart from each other and aligned with a corresponding first button head, a second surface of the second soldering pad being located on the second side of the center substrate, the first side of the center substrate being opposite of the second side of the center substrate such that the first buttons protrude in a direction opposite from the second buttons; and
a button core member extending between the aligned first button head and second button head, the button core being thermally and electronically conductive.

2. The buttoned soldering pad system of claim 1, wherein each first button head has a width dimension that is larger than a width dimension of the first soldering pad.

3. The buttoned soldering pad system of claim 1, wherein each first button head, button core and second button head combination is an integrated member.

4. The buttoned soldering pad system of claim 1, wherein each first button head, button core and second button head include separate members that are coupled together.

5. The buttoned soldering pad system of claim 1, wherein:
the first soldering pad having a first soldering pad aperture extending therethrough for each first button head;
the second soldering pad having a second soldering pad aperture extending therethrough for each second button head;
the center substrate includes one or more substrate apertures extending therethrough; and
each first button head having a button core extending through a first soldering pad aperture, through a substrate aperture, and through a second soldering pad aperture to a corresponding second button head.

6. The buttoned soldering pad system of claim 1, wherein the first soldering pad includes a plurality of first soldering pad apertures extending therethrough, each button core extending through one first soldering pad aperture to the corresponding second button head.

7. An electronic device comprising:
the buttoned soldering pad system of claim 1; and
electronic traces on a substrate that are electronically coupled with the first soldering pad.

8. An electronic device comprising:
the buttoned soldering pad system of claim 5; and
electronic traces on the center substrate that are electronically coupled with the first soldering pad and/or second soldering pad.

9. An electronic device comprising:
a first electronic component having a first buttoned soldering pad;
a second electronic component having a second buttoned soldering pad, the first and second buttoned soldering pads being configured according to buttoned soldering pad system of claim 1; and
a first solder located around a first button head of the first buttoned soldering pad and located around a second button head of the second buttoned soldering pad.

10. The electronic device of claim 9, further comprising:
the first electronic component having a third buttoned soldering pad;
the second electronic component having a fourth buttoned soldering pad, the third and fourth buttoned soldering pads being configured according to the first and second buttoned soldering pads; and
a second solder located around a third button head of the third buttoned soldering pad and located around a fourth button head of the fourth buttoned soldering pad; and
a gap between the first and second solder.

11. The electronic device of claim 10, wherein,
the first buttoned soldering pad and third buttoned soldering pad are electronically isolated from each other by the gap; and
the second buttoned soldering pad and fourth buttoned soldering pad are electronically isolated from each other by the gap.

12. The buttoned soldering pad system of claim 1, wherein each first button head has a width dimension that is smaller than a width dimension of the first soldering pad.

13. The buttoned soldering pad system of claim 1, wherein each first button head has a width dimension that is about the same size of a width dimension of the first soldering pad.

14. The buttoned soldering pad system of claim 1, wherein the first soldering pad has an elongate rectangle shape, and the plurality of first button heads are linearly arranged along the first soldering pad.

15. The buttoned soldering pad system of claim 1, wherein the first button heads each have a first button head top and the second button heads each have a second button head top, the distance from first button head top to second button head top is about 150 microns+/−20%.

16. The buttoned soldering pad system of claim 2, wherein the first button heads each have a first button head top and the second button heads each have a second button head top, the distance from first button head top to second button head top is about 150 microns+/−20%.

17. The buttoned soldering pad system of claim 5, wherein the first button heads each have a first button head top and the second button heads each have a second button head top, the distance from first button head top to second button head top is about 150 microns+/−20%.

18. The electronic device of claim 8, wherein the first button heads each have a first button head top and the second button heads each have a second button head top, the distance from first button head top to second button head top is about 150 microns+/−20%.

19. The buttoned soldering pad system of claim 1, wherein the first button heads each have a first button head top, the distance from first button head top to the first surface of the first soldering pad is about 5 microns to about 50 microns+/−20%.

20. The buttoned soldering pad system of claim 1, wherein the first soldering pad and first button heads are electrically conductive.

21. The buttoned soldering pad system of claim 1, wherein the first soldering pad and first button heads are copper.

22. The buttoned soldering pad system of claim 14, wherein the first soldering pad and first button heads are electrically conductive.

23. The buttoned soldering pad system of claim 14, wherein the first soldering pad and first button heads are copper.

24. The buttoned soldering pad system of claim 1, wherein the plurality of first button heads are linearly arranged along the first soldering pad.

\* \* \* \* \*